United States Patent
Colinge et al.

(10) Patent No.: US 10,164,061 B2
(45) Date of Patent: Dec. 25, 2018

(54) METHOD OF FABRICATING NON-VOLATILE MEMORY DEVICE ARRAY

(71) Applicant: TAIWAN SEMICONDUCTOR MANUFACTURING CO., LTD., Hsinchu (TW)

(72) Inventors: Jean-Pierre Colinge, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/196,126

(22) Filed: Jun. 29, 2016

(65) Prior Publication Data

US 2017/0338237 A1 Nov. 23, 2017

Related U.S. Application Data

(60) Provisional application No. 62/338,604, filed on May 19, 2016.

(51) Int. Cl.
| | |
|---|---|
| *H01L 21/02* | (2006.01) |
| *H01L 29/66* | (2006.01) |
| *H01L 21/28* | (2006.01) |
| *H01L 29/423* | (2006.01) |
| *H01L 29/788* | (2006.01) |
| *H01L 27/11524* | (2017.01) |

(52) U.S. Cl.
CPC .. *H01L 29/66795* (2013.01); *H01L 21/02236* (2013.01); *H01L 21/28273* (2013.01); *H01L 27/11524* (2013.01); *H01L 29/42332* (2013.01); *H01L 29/66825* (2013.01); *H01L 29/7881* (2013.01); *H01L 21/02255* (2013.01)

(58) Field of Classification Search
CPC ......... H01L 21/02236; H01L 21/02532; H01L 21/02595; H01L 21/28282; H01L 27/11568; H01L 27/1211; H01L 29/0649; H01L 29/0673; H01L 29/42348; H01L 29/66795; H01L 29/66833
See application file for complete search history.

(56) References Cited

U.S. PATENT DOCUMENTS

| | | | |
|---|---|---|---|
| 7,425,740 B2 | 9/2008 | Liu et al. | |
| 8,026,521 B1 * | 9/2011 | Or-Bach | ............... H01L 21/268 257/67 |

(Continued)

OTHER PUBLICATIONS

Xiaohui Tang et al., "Energy-Band Engineering for Improved Charge Retention in Fully Self-Aligned Double Floating-Gate Single-Electron Memories", Nano Lett. 2011, 11, 4520-4526.

*Primary Examiner* — Joseph Galvin, III
(74) *Attorney, Agent, or Firm* — McClure, Qualey & Rodack, LLP

(57) ABSTRACT

A method of fabricating nanocrystal memory array includes stacking a silicon layer and a silicon germanium layer on a wafer. A gate oxide layer over is then formed on the silicon layer and the silicon germanium layer. Next, a gate layer is deposited on the gate oxide layer. Subsequently, the gate layer, gate oxide layer and the silicon germanium layer are patterned. Finally, the silicon germanium layer is oxidized. The nanocrystal is sandwiched in between the gate and the silicon layer, and the gate oxide layer surrounds the nanocrystal.

20 Claims, 15 Drawing Sheets

(56) References Cited

U.S. PATENT DOCUMENTS

| | | |
|---|---|---|
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2010/0264468 A1* | 10/2010 | Xu .................. H01L 29/66795 257/288 |
| 2011/0193165 A1* | 8/2011 | Liu .................. H01L 27/10802 257/347 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1* | 9/2014 | Oxland ................ H01L 29/785 257/347 |
| 2015/0001591 A1* | 1/2015 | Akarvardar ........... H01L 29/785 257/288 |
| 2015/0021709 A1* | 1/2015 | Jacob .................. H01L 27/1211 257/401 |
| 2015/0263003 A1 | 9/2015 | Lee et al. |

* cited by examiner

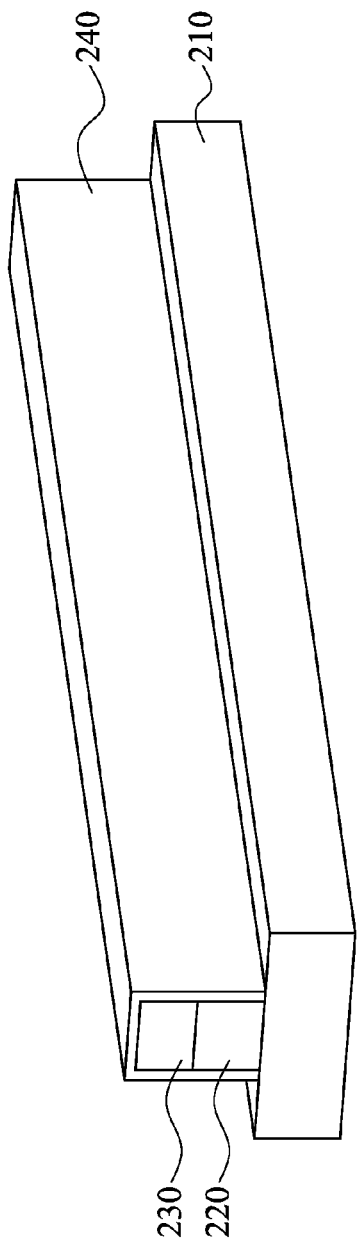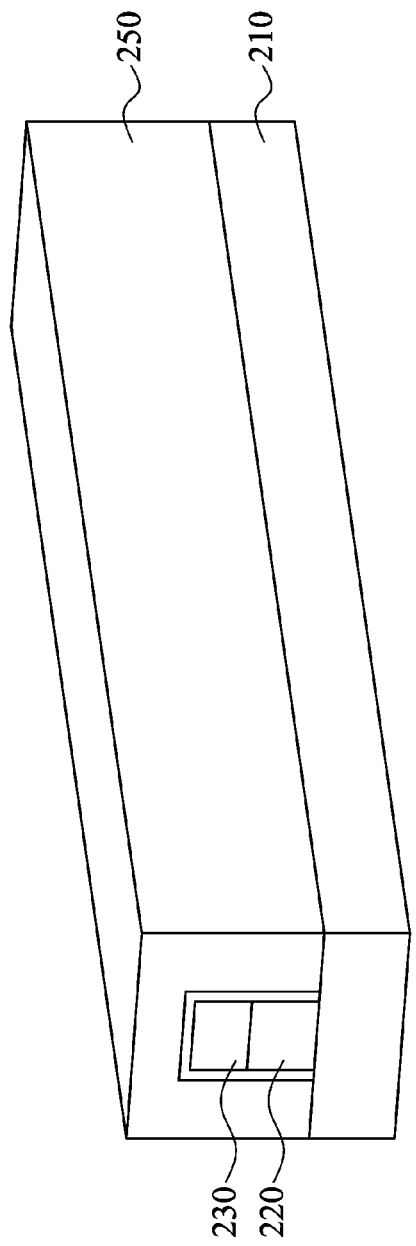
Fig. 2C
Fig. 2D

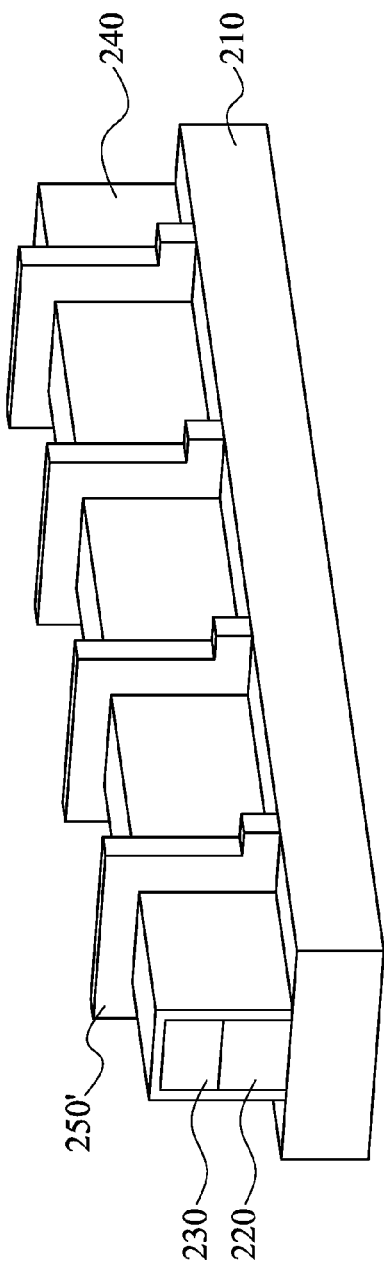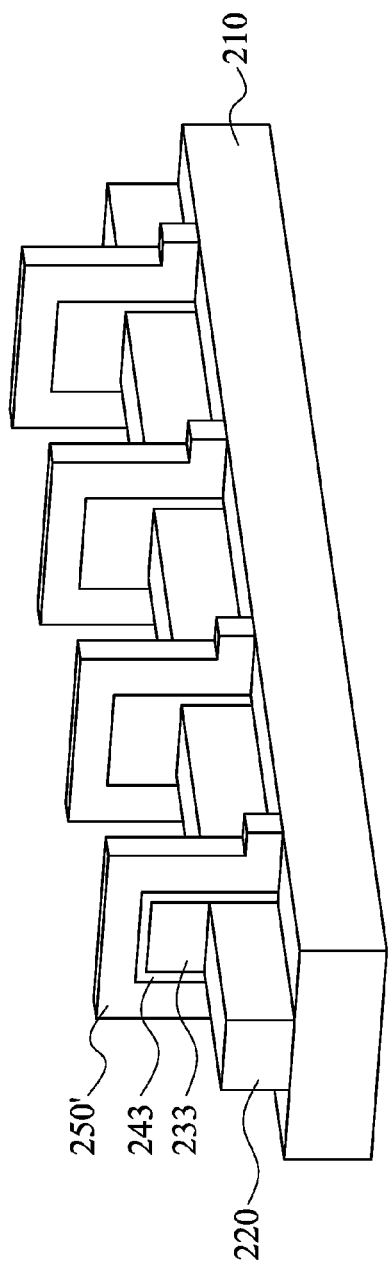

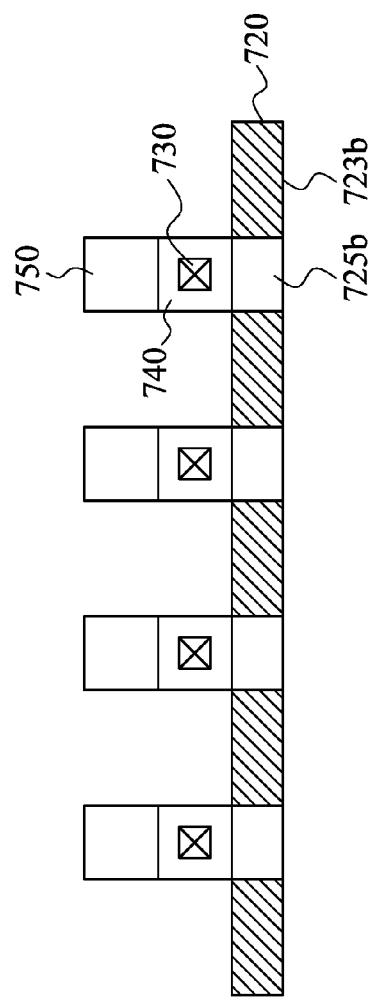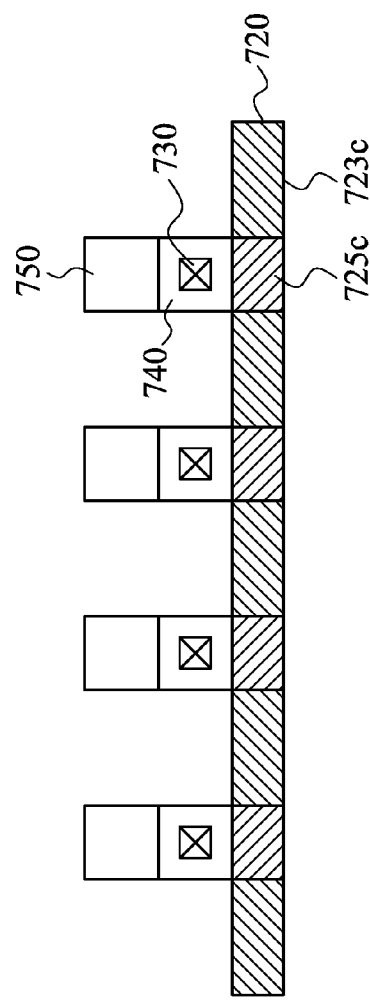

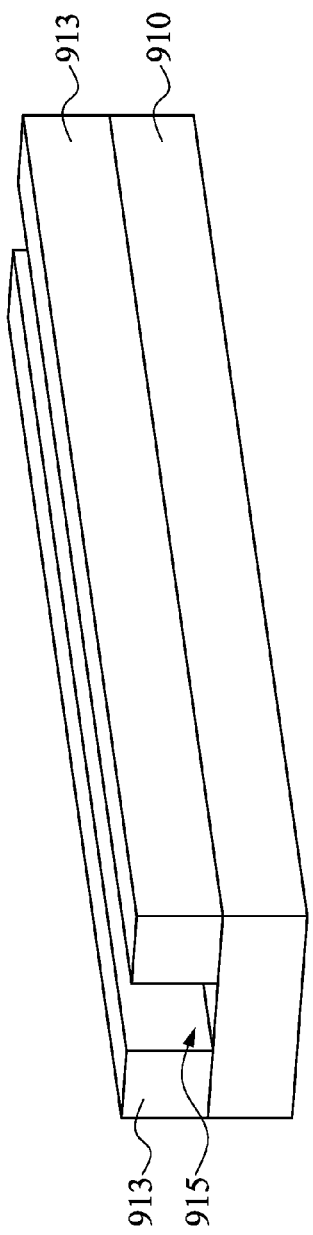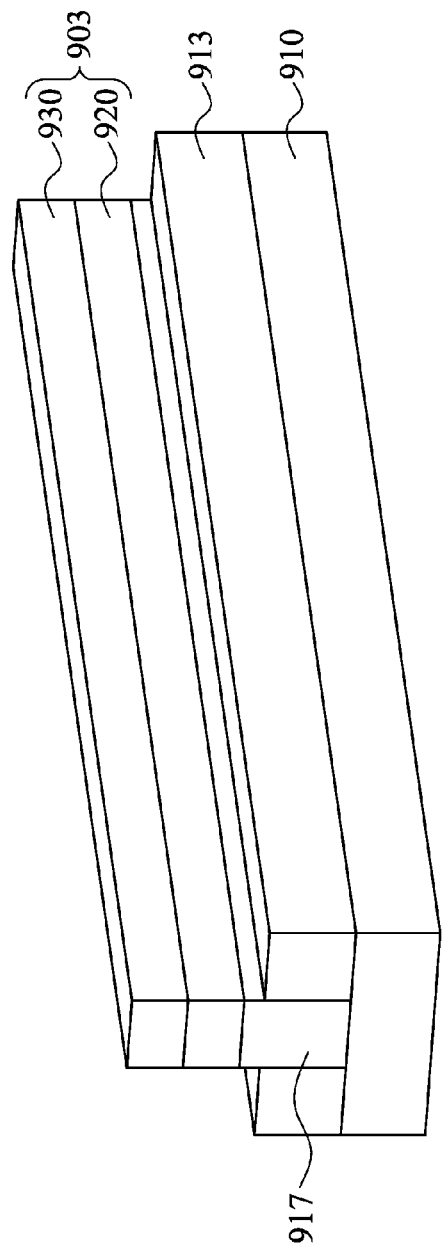
Fig. 9A
Fig. 9B

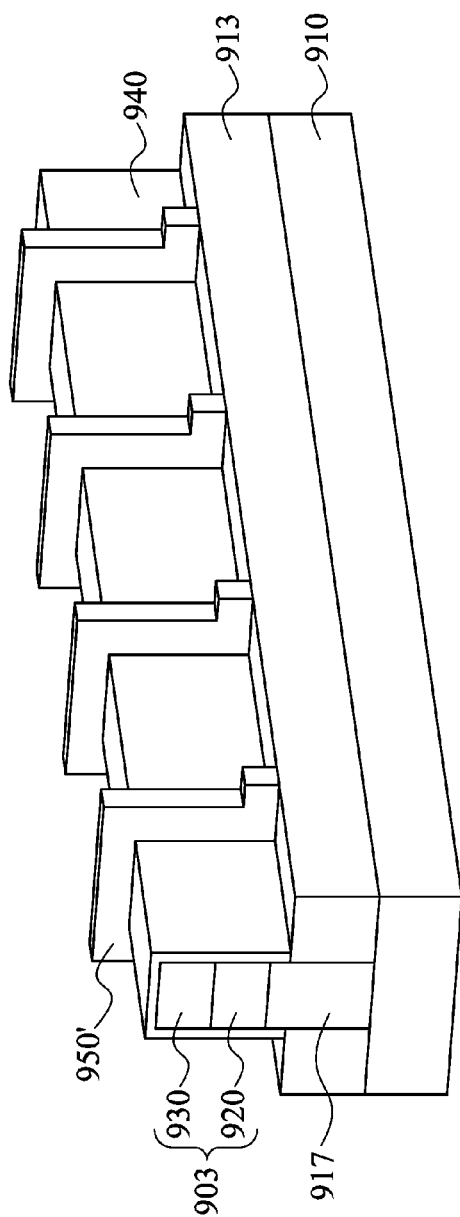
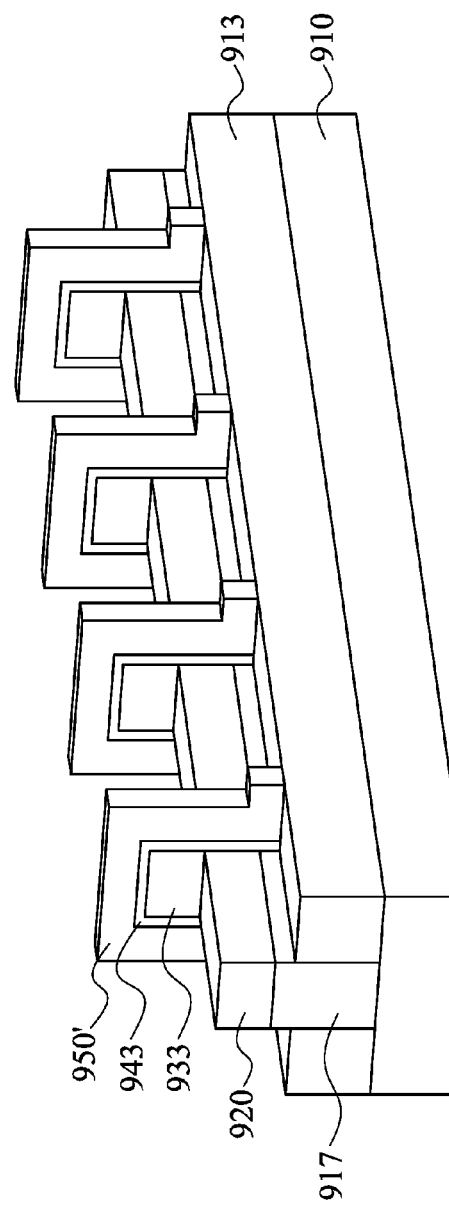
Fig. 9E
Fig. 9F

METHOD OF FABRICATING NON-VOLATILE MEMORY DEVICE ARRAY

PRIORITY CLAIM AND CROSS-REFERENCE

This application claims priority to U.S. Provisional Application Ser. No. 62/338,604, filed May 19, 2016, which is herein incorporated by reference.

BACKGROUND

Computers and many other electronic devices require information storage system that handles and processes data. Some information is stored in volatile memory that is lost when power is removed. While information stored in a hard disk drive, CD-ROM or the like is retained for a significant time in the absence of power. This long-term storage is typically high in capacity but relatively slow in speed. Non-volatile memory system can be reprogrammed, read, and erased electronically, and are therefore suitable for storing audio data in digital players and pictures in digital cameras.

Memory device manufacturing has reached a new generation. One such development includes volatile and non-volatile memory device upgrade. Crucial factors, for example, compactness, efficiency, reliability, low power operation, long life, and low price, are to be retained in a successor. Flash memory is a common non-volatile memory. A typical flash memory cell includes a floating gate for each bit or binary element of information stored. In addition, a series of transistors are required to retrieve specific memory bits or words. The physical configuration of a memory cell is therefore not trivial, because tunnelling of electrons onto and off the floating gate in a non-volatile memory can have great impact on the memory cell capacity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are schematic diagrams illustrating embodiments of the method shown in FIG. 1 in accordance with some embodiments of the instant disclosure;

FIGS. 7A-7C are cross-sectional schematic diagrams illustrating embodiments of a non-volatile memory device array in accordance with some embodiments of the instant disclosure;

FIGS. 9A-9G are schematic diagrams illustrating embodiments of the method shown in FIG. 1 in accordance with some embodiments of the instant disclosure.

DETAILED DESCRIPTION

Figure 1:
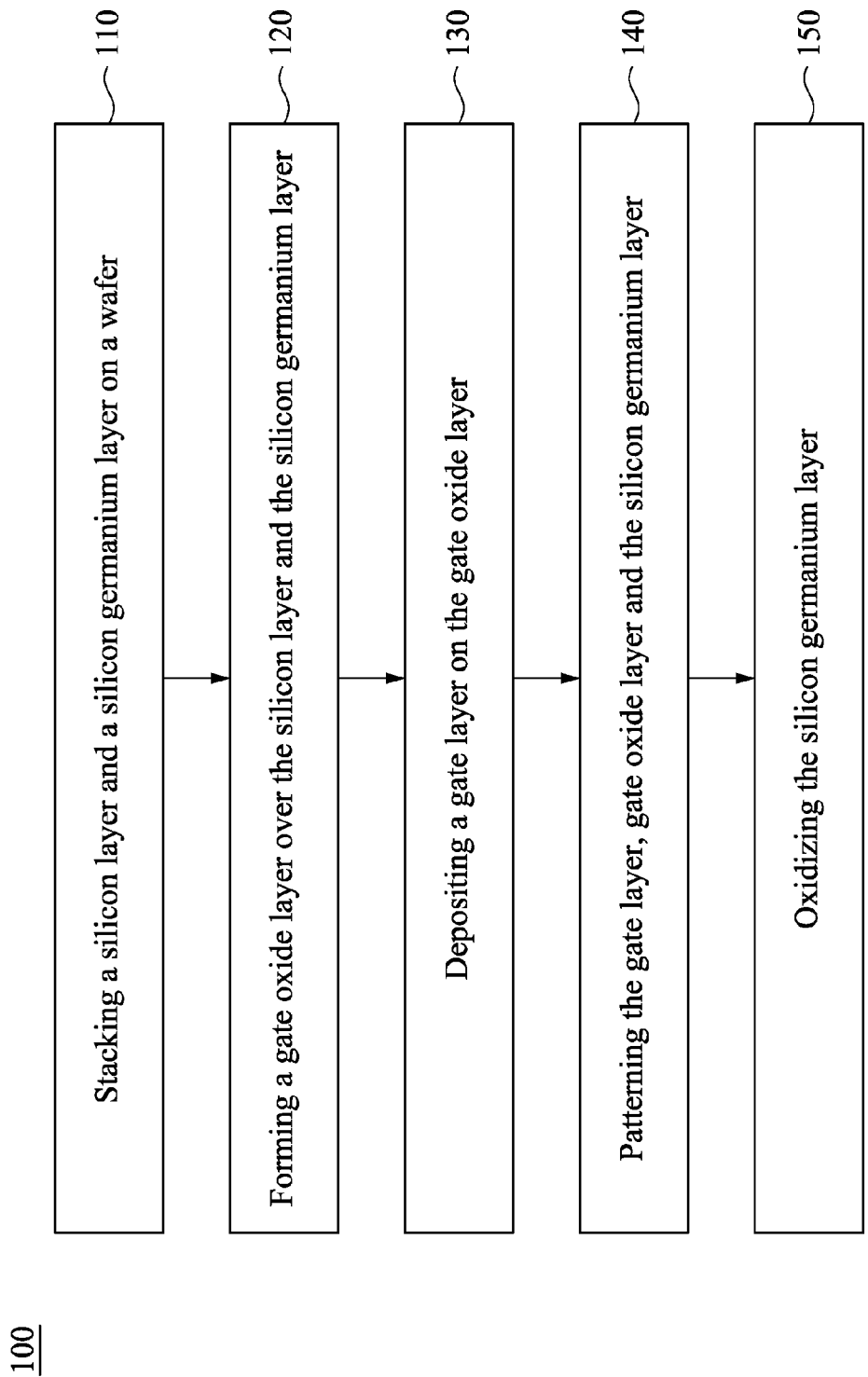
FIG. 1 is a block diagram illustrating an embodiment of a method for fabricating a non-volatile memory device array in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A large number of computer systems and electronic devices store information in the fashion of non-volatile memory. Information stored in non-volatile memories can be retained after power is cut from the device and therefore be accessed for read and process.

A typical non-volatile memory device includes a field effect transistor on a silicon substrate. Data are stored by electrical charge in a separate gate electrode, known as a floating gate. Changing the threshold voltage of the field effect transistor through the electrical charge over the channel region of the transistor allows data storage. For example, in an n-channel enhancement device, a large number of electrons in a floating gate electrode create a high threshold voltage in the field effect transistor. When the control gate is grounded, current does not flow through the transistor, and this is defined as a logic 0 state. A reduction in the number of electrons creates a low threshold voltage. In this condition, when the control gate is grounded, current flows through the field effect transistor, and this is defined as a logic 1 state.

Flash electrically erasable programmable read only memory (EEPROM) is a common type of non-volatile memory device. The term "flash" was named in part because a flash operation is used to erase the content of a block of data simultaneously with electrical pulses.

An array of nanocrystal floating gates for non-volatile memory array retains data in similar mechanism. The charge storage nanocrystals are arranged in a crossbar array. Bars along a longitudinal direction are word lines, while bars perpendicular to the longitudinal bars are bit lines. Nanocrystals are sandwiched at the intersection where a word line and a bit line meet and capable of being charged or discharged with electrons as in any flash EEPROM memory. Data storage takes place when the threshold voltage is changed. In more detail, a charged nanocrystal yields a lower threshold voltage, whereas an uncharged nanocrystal yields a higher threshold voltage, and the shift between low and high threshold voltage indicates the switch of logic state 1 and 0. The nanocrystal floating gate can thus be used as a flash memory storage element. The nanocrystal floating gate exhibits flash storage capability and has higher density without the need of selector switches. The construction of nanocrystal floating gate allows self alignment between the word line and the bit line resembling NAND configuration. Method of fabricating the nanocrystal crossbar array and embodiments are elaborated hereinafter.

Turning now to FIG. 1, illustrated is an embodiment of a method 100 for fabricating a nanocrystal floating gate structure. Embodiments of the method 100 shown in FIG. 1 are further illustrated in the schematic diagrams of FIGS. 2A through 2G, and reference should be made to these figures as called out in the text below.

Figure 2A:
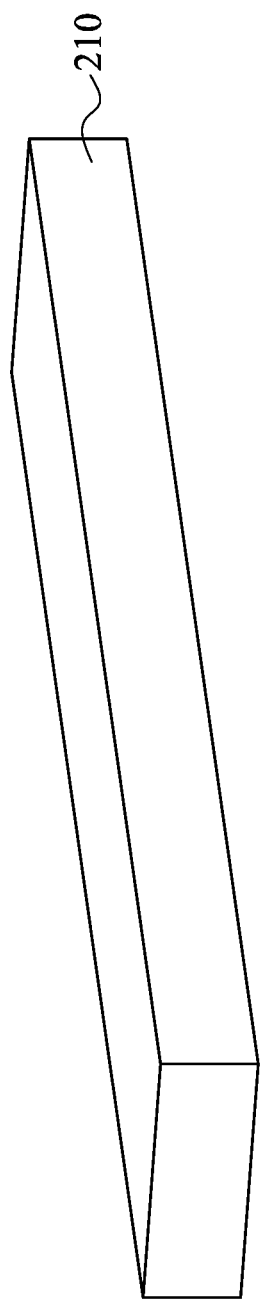
Figure 2B:
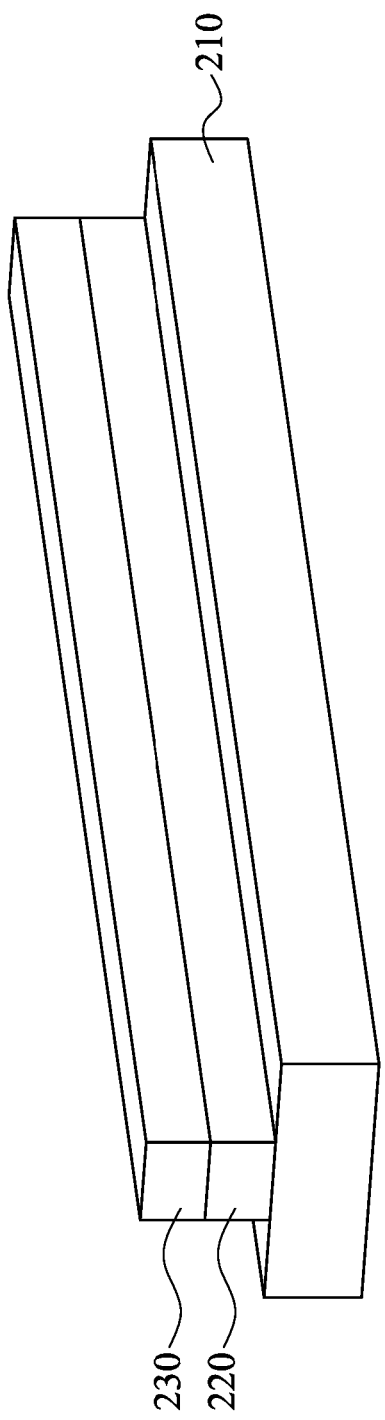

As set forth in operation 110 in FIG. 1, a silicon layer and a silicon germanium layer are formed on a wafer. This is illustrated in FIGS. 2A and 2B, which show the wafer 210, the silicon layer 220 and the silicon germanium layer 230. Referring to FIG. 2A, the wafer 210 includes a substrate, and this substrate may include any suitable material or combination of materials upon which a non-volatile memory device (or other device) may be formed. In one embodiment, the wafer 210 includes doped silicon, for example boron doped p-type silicon. However, it should be understood that the disclosed embodiments are not limited to silicon substrates and, further, that the disclosed embodiments may be practiced with other substrate materials. Attention is invited to FIG. 2B, illustrating the silicon layer 220 and the silicon germanium layer 230 formed on the wafer 210. The silicon layer 220 is in a shape of strip (nanowire) disposed on the surface of wafer 210 by, for example, epitaxy. A dimension of the silicon layer 220 measures a thickness ranging from 15-25 nm and a width ranging from 3-15 nm. In some embodiments, the silicon layer 220 has a thickness of 20 nm and a width of 5 nm. The silicon layer 220 may be doped with n-type dopant, for example, phosphorus. The wafer 210 and silicon layer 220 have complementary dopant. For example, if the wafer 210 contains p-type substrate, the silicon layer 220 is n-type doped. Likewise, if the wafer 210 contains n-type substrate, the silicon layer 220 is p-type doped. In some embodiments, the silicon layer 220 serves as a bit line in a fin field effect transistor (FinFET, trigate FET or nanowire FET).

Conventional floating gate employs polysilicon. Silicon (Si) and germanium (Ge) are used in the silicon germanium layer 230 in order to achieve lower power consumption, faster access speed, and higher integration density over conventional metallic materials. The silicon germanium has a general formula, $Si_{1-x}Ge_x$, where x is a number smaller than 1 and larger than 0 ($0<x<1$). In some embodiments, the silicon germanium layer 230 has a formula of $Si_{0.7}Ge_{0.3}$. The silicon germanium layer 230 is disposed on the silicon layer 220 by, for example, epitaxy. Shape of the silicon germanium layer 230 resembles that of the silicon layer 220 in a strip (nanowire). A dimension of the silicon germanium layer 230 measures a thickness ranging from 5-25 nm and a width ranging from 3-15 nm. In some embodiments, the silicon germanium layer 230 has a thickness of 10 nm and a width of 5 nm. The silicon germanium layer 230 may have a different thickness from the silicon layer 220, while the width of the silicon layer 220 and the germanium layer 230 is of the same value. The thickness of the silicon germanium layer 230 is related to the formation of nanocrystals which will be described in more detail in the following text. In some embodiments, the silicon germanium layer 230 is the word line in a FinFET.

As set forth in operation 120, a gate oxide layer is formed over the silicon layer and the silicon germanium layer. This is illustrated in FIG. 2C, where the gate oxide layer 240 is deposited by, for example atomic layer deposition (ALD), over the silicon germanium layer 230 and the silicon layer 220. The gate oxide layer 240 may be a high-k material, for example, $HfO_2$ and HfSiON, that blankets the exposed surface of the silicon layer 220 and the silicon germanium layer 230. The gate oxide can also be thermally grown, thereby forming a layer of SiO2 or silicon oxynitride. The exposed surface of the silicon germanium layer 230 includes the top surface and the two sides thereof. Two sides of the silicon layer 220 are also covered by the gate oxide layer 240 in the gate oxide layer growth.

As set forth in operation 130, a gate layer is deposited on the gate oxide layer. This is illustrated in FIG. 2D, where a gate layer 240 is formed on the wafer 210. The gate layer 240 may be a polysilicon gate layer that wraps around the silicon layer 220 and silicon germanium layer 230. As set forth in operation 140, the gate layer, gate oxide layer and the silicon germanium layer are patterned. This is illustrated in FIG. 2E, where the gate layer 250 is patterned to form the gates 250'. The gate layer 250 undergoes etching process common in the filed and exhibits desirable gate pattern. Referring back to FIG. 2E, in some embodiments, after the etching process, the gates 250' are in a fashion that is substantially perpendicular with respect to the silicon layer (nanowire) 220 and the silicon germanium layer 230 in a plan view. The gate layer 250 is patterned to form a plurality of bands, each of which braces across the surface of the gate oxide layer 240. A width of a single gate 250', which measures the narrow band width of the gate 250' in a plan view, ranges from approximately 5 to 15 nm. A gap is created in between each pair of immediately abreast gates 250', and a distance of the gap measures from approximately 10 to 30 nm. In some embodiments, the gate 250' has a width of 8 nm, and the gap is double the width, which is 16 nm.

Attention is now invited to FIG. 2F, patterning of the gate layer 250 further includes patterning of the gate oxide layer 240 and the silicon germanium layer 230. The patterned gates 250' may serve as a hard mask for the underlying layers. Alternatively, an additional hard mask may be used and disposed on the gates 250' when the gate oxide layer 240 and the silicon germanium layer 230 undergo patterning. Portions of the gate oxide layer 240 and the silicon germanium layer 230 are removed by, for example, etching process, and the remaining portions of the gate oxide layer 240 and the silicon germanium layer 230 reflects the pattern of the gates 250'. That is, gate oxide layer 240 and the silicon germanium layer 230 that are exposed on the gaps in between any pair of the gates 250' are removed in the etching process. Consequently, the gate oxide layer 240 is transformed into a plurality of gate oxide layers 243, and the silicon germanium layer 230 to a plurality of silicon germanium layers 233. The gate oxide layer 243 and the silicon germanium layer 233 obtain similar width as the gate 250' because the gates 250' act as the hard mask during the etching process.

As shown in FIG. 2F, the silicon layer 220 retains its integrity because of different etching properties from the silicon germanium layer 230 and the gate oxide layer 240. The silicon layer 220 is relatively resistant or inert to the etching agent used to treat the gate oxide layer 240 and the silicon germanium layer 230, and as a result, the patterning process of the gate layer 250, gate oxide layer 240 and silicon germanium layer 230 leaves the silicon layer 220 as a nanowire.

Figure 2G:
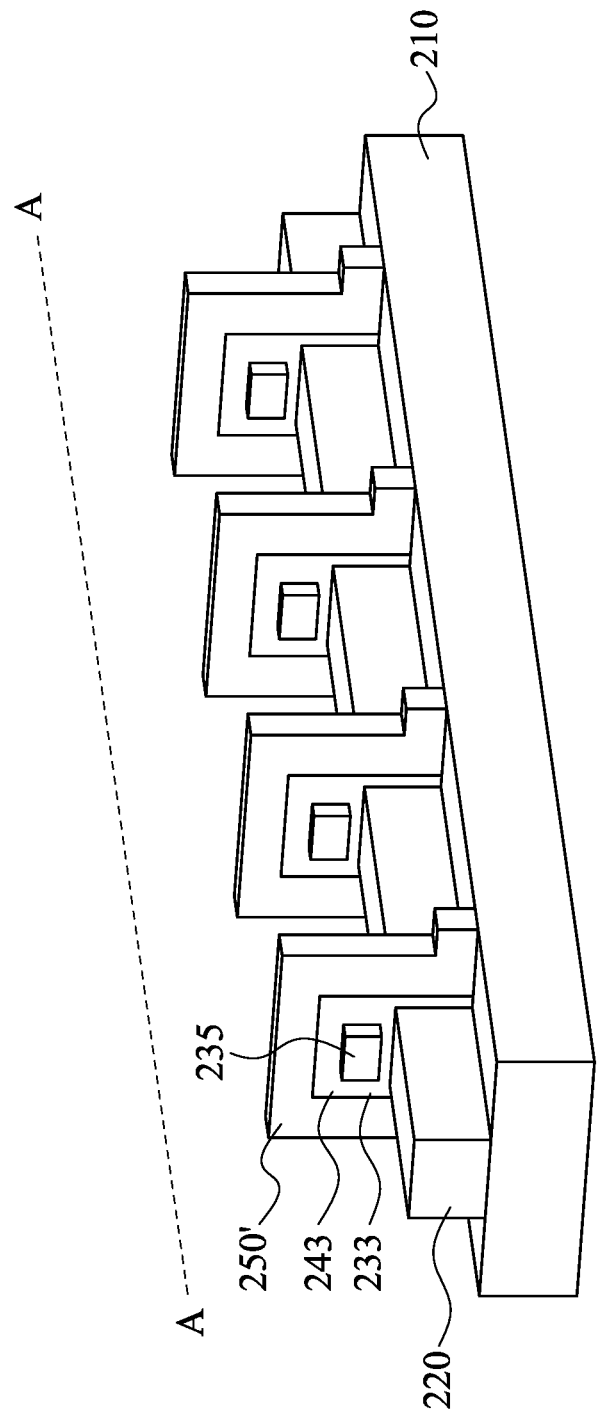

As set forth in operation 150, the silicon germanium layer is oxidized. This is illustrated in FIG. 2G, where the silicon germanium layer 233 undergoes oxidation and forms nanocrystal 235. The oxidation involves heating wafer in the presence of oxygen, for example, wet oxidation at approximately 750° C. for 1 hour. When oxidation takes place, germanium nanocrystals 235 are formed. The formation of germanium nanocrystals 235 is related to the starting alloy composition according to the theory of binary alloy oxidation. The alloy composition determines the oxide growth fashion. In the case of silicon germanium layer 233, which has a formula of $Si_{0.7}Ge_{0.3}$, silicon has a faster oxidation rate in comparison with germanium. It is due to the difference of Gibbs free energy in SiO2 and GeO2. More specifically, SiO2 has a larger negative Gibbs free energy than GeO2, and as a result, silicon is oxidized much faster than the germanium to form SiO2. Germanium agglomerates during oxidation, and a Ge-rich nanocrystal gradually nucleates. Silicon reacts with the oxygen pumped into the reaction chamber, and simultaneously silicon reacts with oxygen diffuses from the gate oxide layer 243. Consequently, a tunnel oxide layer 245 is formed at the interface between the germanium nanocrystal 235 and the silicon layer 220. Oxygen concentration decreases at the site where silicon reacts with oxygen, and germanium is less likely to be oxidized in comparison with silicon. The germanium nanocrystal 235 is then surrounded by a film constituted of existing gate oxide layer 243 and the tunnel oxide layer 245 that is formed when the silicon germanium layer 233 is oxidized. In some embodiments, the tunnel oxide layer 245 is thinner than the gate oxide layer 243. The film that surrounds the germanium nanocrystal 235 may not have uniform thickness because of oxidation variations.

The selection of materials is important in the formation of nanocrystal structure because the etching rate and the oxygen affinity have influence on the nanocrystal construction. The dimension of the nanocrystal and tunnel oxide layer are controlled by their starting material dimensions and can be fined tuned in the oxidation process. The germanium nanocrystal 235 has a diameter ranging from approximately 2 to 10 nm. In some embodiments, the germanium nanocrystal 235 has a diameter measures approximately 3-8 nm.

Figure 3:
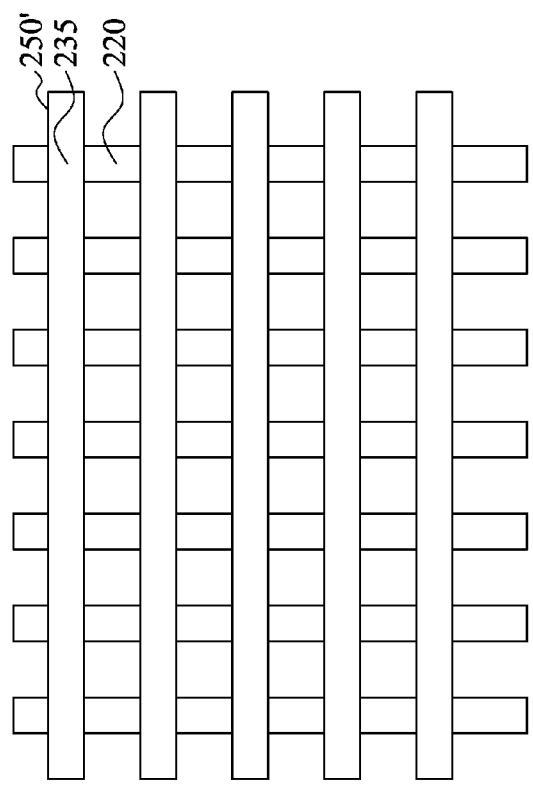
FIG. 3 is a schematic diagram illustrating an embodiment of a non-volatile memory device array in a plan view in accordance with some embodiments of the instant disclosure.

FIGS. 2A-2G show a single strip of the nanocrystal memory device. Attention is now invited to FIG. 3, illustrating a non-volatile memory array in plan view. Wafer 210 and gate oxide layer 243 are omitted in the diagram for the sake of clarity. A plurality of silicon layers 220, a plurality of gates 250' and a plurality of nanocrystals 235 are shown in FIG. 3. This crossbar configuration includes silicon layers (nanowires) 220 arranged substantially in parallel in a first direction, while the gates 250' are arranged substantially in parallel in a second direction and overlap the silicon layers 220. The first and second directions are substantially perpendicular to each other, and the resulting pattern in plan view resemble a grid, which has the silicon layers 220 as the longitudinal lines and the gates 250' as the latitudinal lines, and vice versa. At the intersection of the gate 250' and the silicon layer 220 is the nanocrystal 235 sandwiched in between. In some embodiments, the silicon layer 220 is the bit line, and the gate 250' is the word line. The nanocrystal 235 is charged or discharged with electrons and switches between logic state 0 or 1 for data retention.

Figure 4:
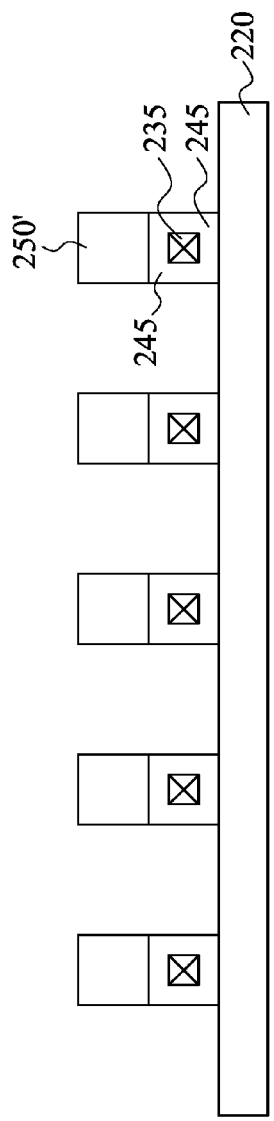
FIG. 4 is a cross-sectional schematic diagram along line A-A in FIG. 2G illustrating an embodiment of a non-volatile memory device array in accordance with some embodiments of the instant disclosure.

Attention is now invited to FIG. 4, illustrating a cross-sectional view along line A-A in FIG. 2G. The wafer 210 is not shown in the diagram. The nanocrystal 235 is enclosed by the film of oxide, including existing gate oxide layer 243 and newly formed tunnel oxide layer 245 during oxidation process. The nanocrystal 235 is sandwiched in between the gate 250' and the silicon layer 220. In some embodiments, the silicon layer 220 is bit line, and the gate 250' is the word line. The bit line may be doped with one type of dopant, while the transistor remains junctionless since the bit line contains only a single type of dopant.

Figure 5A:
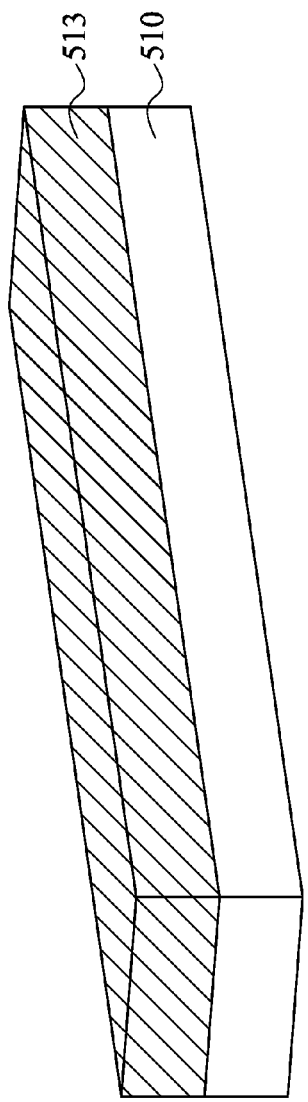
FIGS. 5A-5B are schematic diagrams illustrating embodiments of the method shown in FIG. 1 in accordance with some embodiments of the instant disclosure.
Figure 5B:
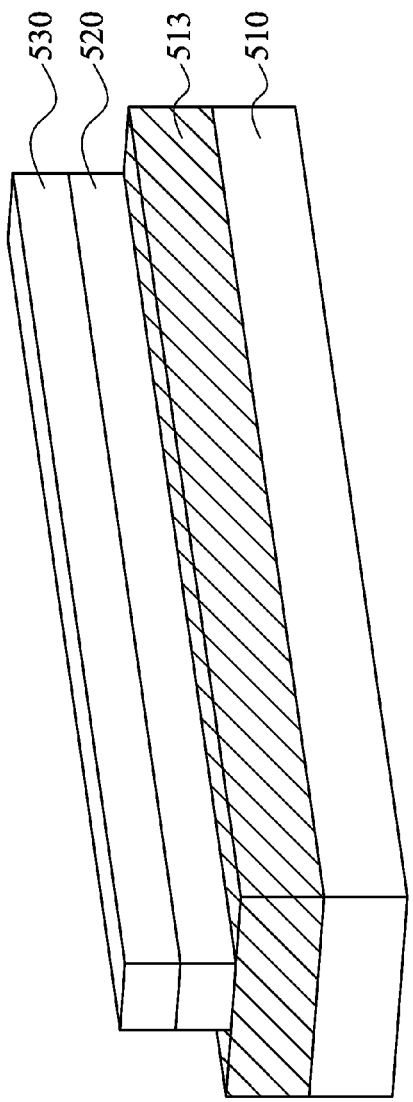

Attention is now invited to FIGS. 5A and 5B, illustrating embodiments of the method shown in FIG. 1. The wafer 510 is a silicon-on-insulator wafer, and the wafer 510 includes a silicon oxide layer 513. The silicon layer 520 and the silicon germanium layer 530 are epitaxial grown on the silicon oxide layer 513. Detailed description of the remaining process is similar to the embodiments shown through FIGS. 2C to 2G and is not repeated to satisfy clarity and brevity.

Figure 6A:
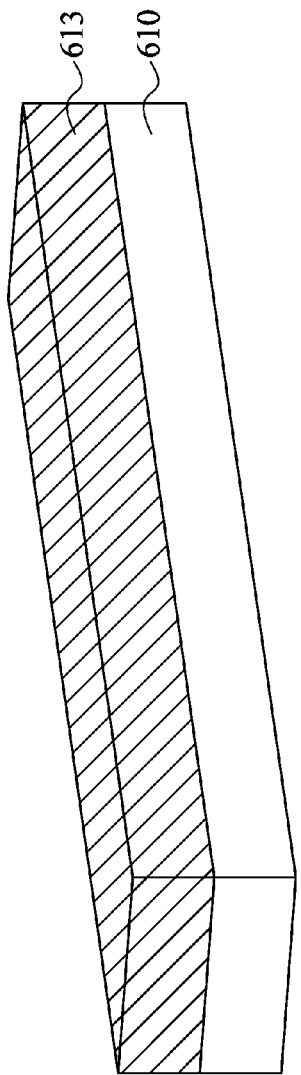
FIGS. 6A-6B are schematic diagrams illustrating embodiments of the method shown in FIG. 1 in accordance with some embodiments of the instant disclosure.
Figure 6B:
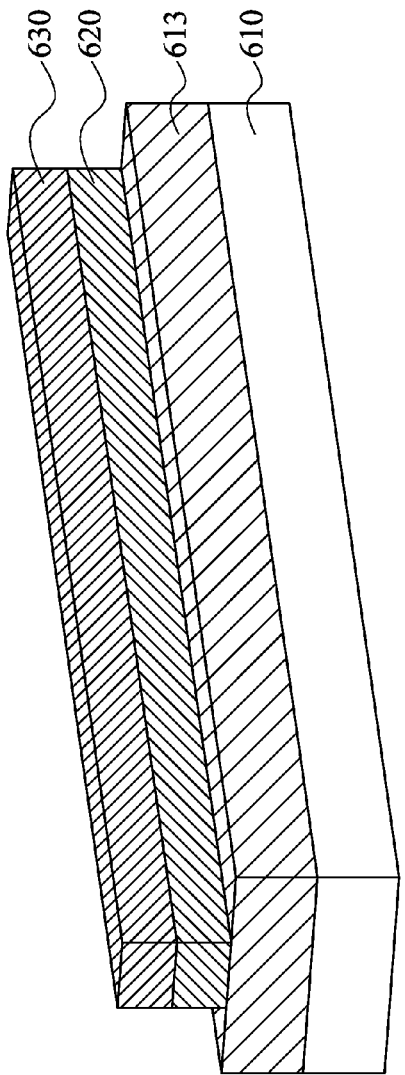

Attention is now invited to FIGS. 6A and 6B, illustrating embodiments of the method shown in FIG. 1. The wafer 610 may be stacked on an existing circuit, for example, CMOS circuit. The wafer 610 includes an insulator. In some embodiments, the insulator is an interlayer dielectric layer 613. The silicon layer 620 and the silicon germanium layer 630 are epitaxial grown on the interlayer dielectric layer 613. In this embodiment, the silicon layer 620 and the silicon germanium layer 630 are polycrystalline, and these elements are at the second level of an active device. Detailed description of the remaining process is similar to the embodiments shown through FIGS. 2C to 2G and is not repeated to satisfy clarity and brevity. The nanocrystal memory array can be easily integrated into other components.

Figure 7A:
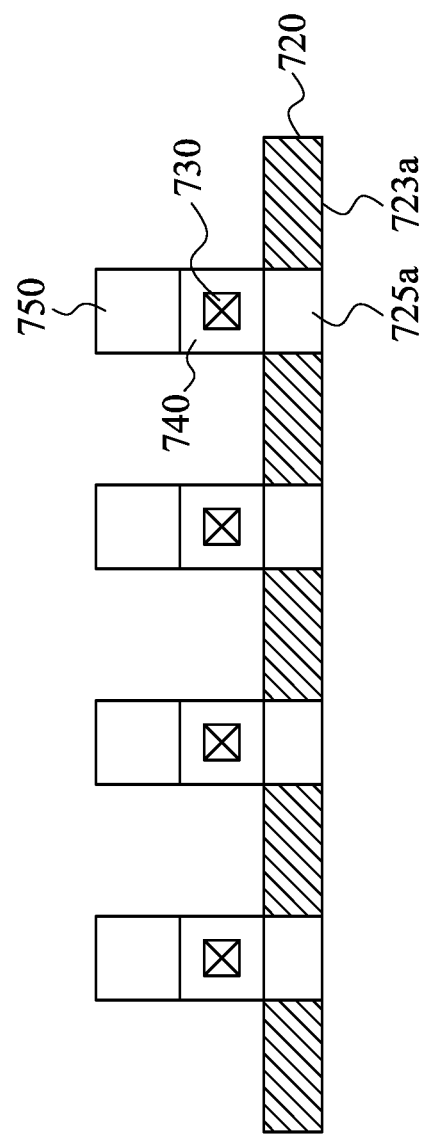

Attention is now invited to FIGS. 7A-7C, illustrating embodiments of cross-sectional view of the nanocrystal memory array device. The nanocrystal memory array device as shown in FIG. 4 may be further processed to form as a junction transistor. As shown in FIG. 7A, the silicon layer is in an accumulation mode, including heavily doped regions 723a and lightly doped regions 723b. The heavily doped regions 723a and the lightly doped regions 723b are in alternative arrangement. The silicon layer 720 may be n- or p-type doped according to design requirement. The doping concentration gradient occurs because of the shielding effect by the gate 750, including the overlying gate oxide layer 740 and the nanocrystal 730. The lightly doped regions 725a is aligned with the gate 750, while the heavily doped regions 723a are the exposed area on the silicon layer 720. The doping pattern corresponds to the grid-like arrangement, which involves the gates 750 overlapping the silicon layers 720. The transistor therefore has junctions on the silicon layer (nanowire) 720.

In some embodiments, the silicon layer 720 is doped in a different fashion. For example, as shown in FIG. 7B, the silicon layer 720 includes doped regions 723b and intrinsic regions 725b arranged alternatively. Unlike lightly doped regions 725a, the intrinsic regions 725b are undoped. This doping pattern allows the transistor to be in an inversion mode. The undoped regions 725b are aligned with the gates 750, while the doped regions 723b are the exposed area on the silicon layer 720. In some embodiments, the transistor is in inversion mode in the silicon layer 720. As shown in FIG. 7C, the silicon layer 720 is doped with n- and p-type dopant. For example, the n-type dopant is implanted at the exposed area to form n-type doped regions 723c. The p-type dopant is implanted at the area aligned with the gate 750 to form p-type doped regions 725c. In this embodiment, the resulting product is in an inversion mode.

Figure 8:
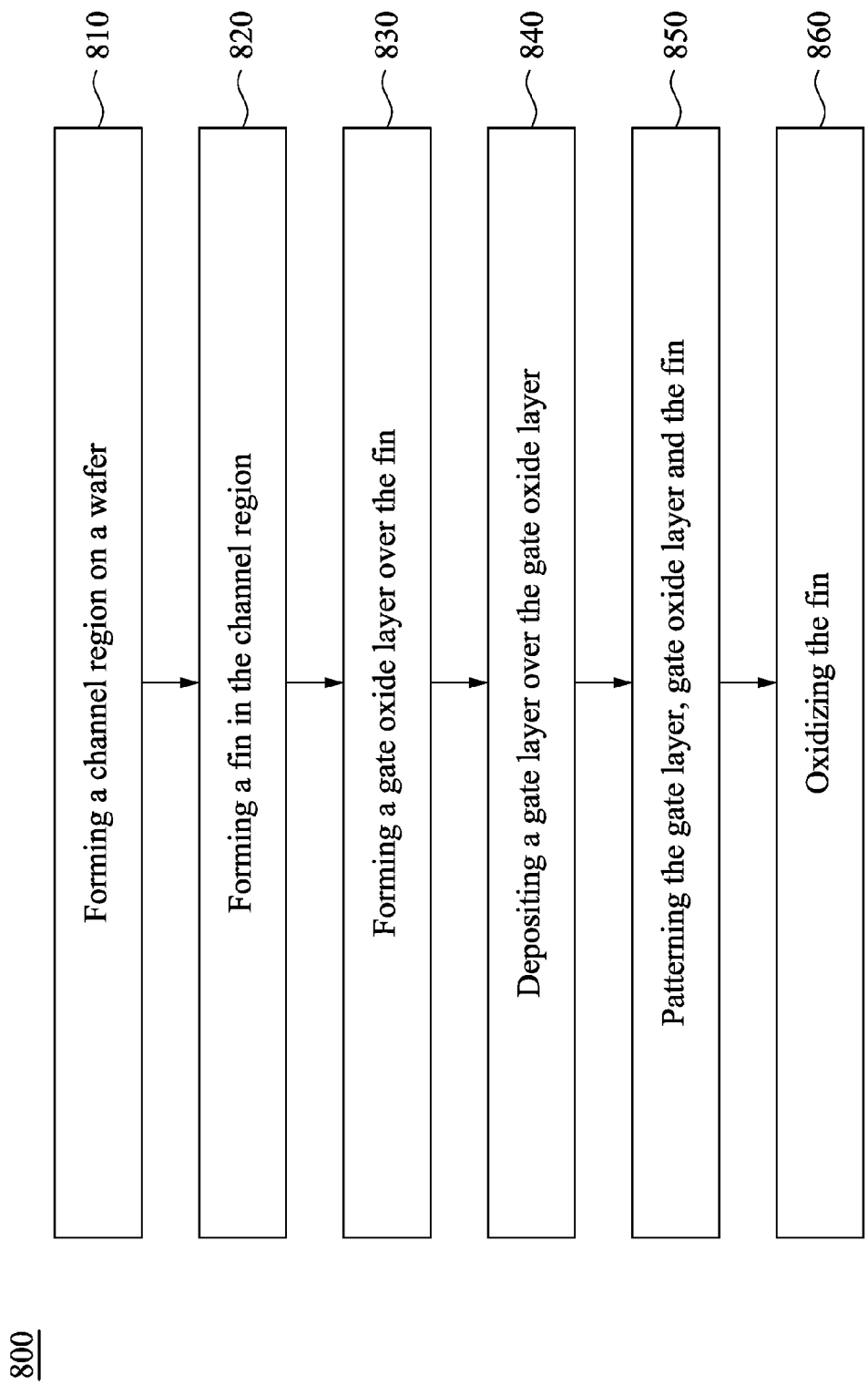
FIG. 8 is a block diagram illustrating an embodiment of a method for fabricating a non-volatile memory device array in accordance with some embodiments of the instant disclosure.

Turning now to FIG. 8, illustrated is an embodiment of a method 800 for fabricating a nanocrystal memory device including nanocrystal array. Embodiments of the method 800 shown in FIG. 8 are further illustrated in the schematic diagrams of FIGS. 9A through 9G, and reference should be made to these figures as called out in the text below.

As set forth in operation 810, a channel region is formed on a wafer. Source and drain regions (not shown) are formed to define the channel region 915 and a pair of insulating structure is disposed along the elongated channel region 915. This is illustrated in FIG. 9A, which the pair of insulating structure is disposed on the wafer. The wafer 910 is similar to the wafer as previously described in the embodiment shown in FIG. 2A. Details can be referred to the wafer 210, and it is not repeated to avoid redundancy. The pair of insulating structure may be, for example, shallow trench isolators 913 as shown in FIG. 9A. Each pair of the shallow trench isolators 913 defines a channel region 915 in between. Attention is now invited to FIG. 9B. A bottom silicon layer 917 is formed in the channel region 915 and overfills the void. The bottom silicon layer 917 exceeds the surface of the shallow trench isolators 913 to a higher level.

Still referring to FIG. 9B, as set forth in operation 820 shown in FIG. 8, a fin 903 is formed in the channel region. A fin 903 is then formed on the bottom silicon layer 917. In some embodiments, the fin 903 includes a silicon layer 920 and a silicon germanium layer 930 disposed on the silicon layer 920 in succession. The fin 903 is formed by, for example, epitaxial growth, on the bottom silicon layer 917 and has similar shape as the bottom silicon layer 917. The bottom silicon layer 917 serves to prevent current leakage to the wafer 910 from the fin 903.

As set forth in operation 830, a gate oxide layer is formed over the fin 903. Please refer to FIG. 9C. A gate oxide layer 940 is formed by, for example, atomic layer deposition, on the surface of the fin 903, which includes the top and two sides of the silicon germanium layer 930 and the two sides of the silicon layer 920. A portion of bottom silicon layer 917 protrudes above the surface of shallow trench isolators 913, and therefore the protruded bottom silicon layer 917 is covered by the gate oxide layer 940.

Figure 9C:
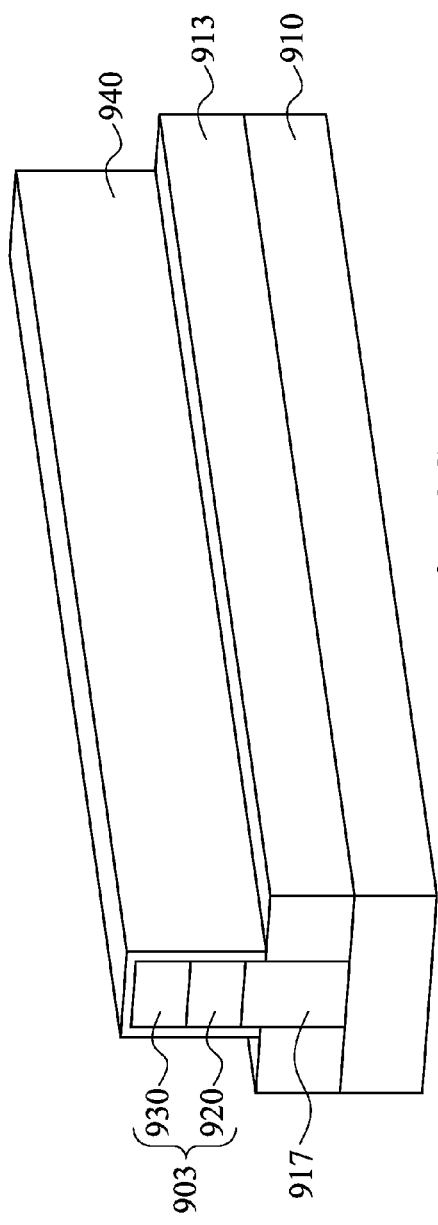
Figure 9D:
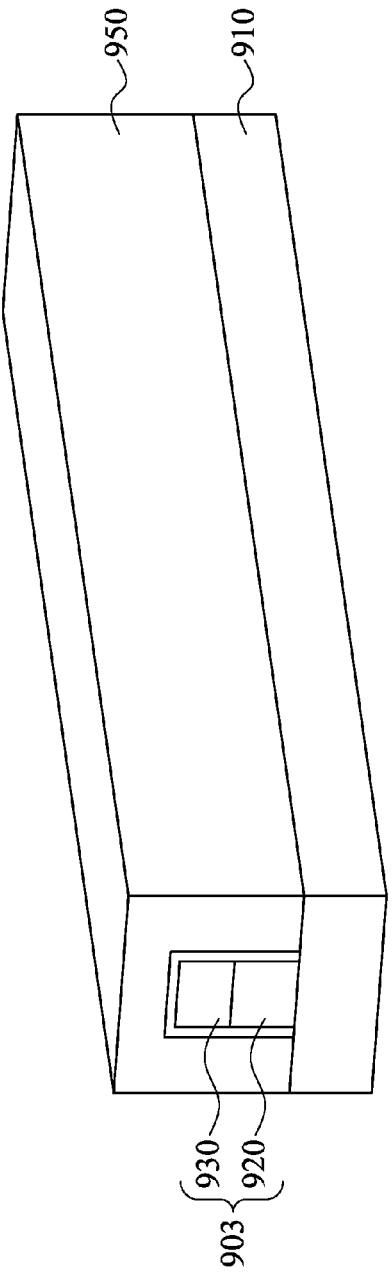

Turning now to FIG. 9D, as set forth in operation 840 shown in FIG. 8, a gate layer 950 is formed on the wafer 910. The gate layer 950 blankets the fin 903, which is covered by the gate oxide layer 940, and the surface of the shallow trench isolators 913. As set forth in operation 850, the gate layer, gate oxide layer and the fin are patterned. Attention is now invited to FIG. 9E. In the patterning process, the gate layer 950 is firstly patterned to form a plurality of gaps. The gate layer 950 is etched to form a plurality of gate 950' in strips. The resulting gates 950' in strips are substantially perpendicular to the underlying silicon layer 920 in plan view. The gaps in between each of the gates 950' measures of approximately 6 to 30 nm.

Referring to FIG. 9F, subsequently, the gates 950' may be used as a hard mask, or alternatively, an additional hard mask may be used for the patterning of the gate oxide layer 940 and the fin 903. The gate oxide layer 940 and the fin 903 are then etched according to the pattern created by the gates 950'. The exposed portions of the gate oxide layer 940 and the fin 903, i.e., portions that are not covered by the gates 950', are removed in the etching process. The gate oxide layer 940 turns into gate oxide layer 943, which is like a narrow band flanking the fin 903, and only the silicon germanium layer 930 under the shielding of the gates 950' is remained as the silicon germanium layers 933 shown in FIG. 9F.

Figure 9G:
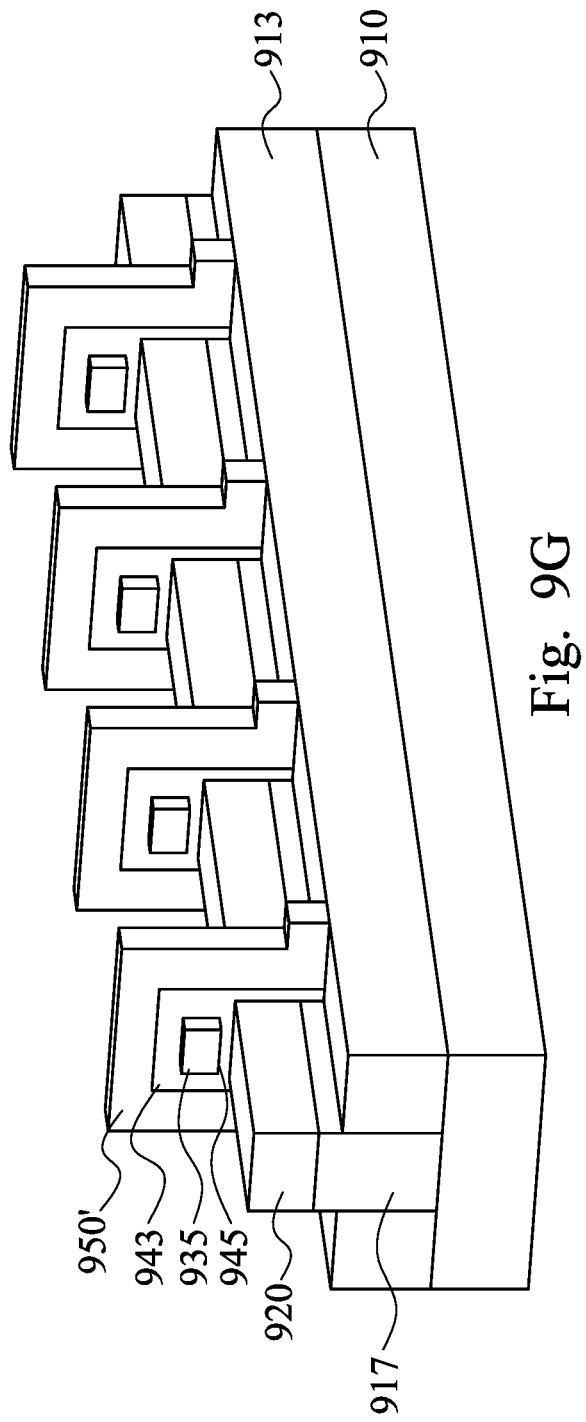

The silicon layer 920 of the fin 903 remains intact in the patterning process because of the difference in etching rate. The materials used as the fin 903 are therefore important due to process criteria and design requirement. More specifically, the fin 903 includes layers of materials that exhibit significantly different etching rate against the same etching agent. As set forth in operation 860, the fin is oxidized. This is illustrated in FIG. 9G, which the germanium layers 933 are oxidized to form a plurality of nanocrystals 935. After the oxidation process, which involves heating the wafer in oxygen, the silicon germanium layers 933 turns into a plurality of germanium-rich nanocrystals 935 sandwiched in between the gate 950' and the silicon layer 920 and surrounded by the gate oxide layer 943 and a tunnel oxide layer 945. Detail information for achieving the final product as shown in FIG. 9G can be referred back to FIGS. 2C through 2G as previously described. Identical components are interchangeable among the embodiments. It is not repeated hereinafter to satisfy the requirement of clarity and brevity.

The method of fabricating non-volatile nanocrystal memory array allows nanocrystal self-alignment between the gate (word line) and the nanowire (bit line). The selection of materials is important because the etching rate and oxidation affinity play a pivotal role in the formation of nanocrystal. In addition, the dimension of the nanocrystal may be tuned according to the thickness of the starting material. The nanocrystal offers flash storage capability in the switch between 0 and 1 logic state. Given a fin pitch and a gate pitch both measuring of about 10 nm, the crossbar array of nanocrystal memory device has approximately a density of 10 Gb/$mm^2$ without the need of selector switches. The non-volatile memory device array satisfies low power consumption, fast access speed, and high integration density to a significant extent.

In some embodiments, the method of fabricating nanocrystal memory array includes stacking a silicon layer and a silicon germanium layer on a wafer. A gate oxide layer over is then formed on the silicon layer and the silicon germanium layer. Next, a gate layer is deposited on the gate oxide layer. Subsequently, the gate layer, gate oxide layer and the silicon germanium layer are patterned. Finally, the silicon germanium layer is oxidized.

In some embodiments, the method of fabricating nanocrystal memory device includes, forming a channel region on a wafer. Next, a fin is formed in the channel region. Following that, a gate oxide layer is formed over the fin. A gate layer is then deposited over the gate oxide layer. Subsequently, the gate layer, gate oxide layer and the fin are patterned. Finally, the fin is oxidized to form nanocrystals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    stacking a silicon layer and a silicon germanium layer above a wafer such that the silicon germanium layer is above the silicon layer;
    forming a gate oxide layer over the silicon layer and the silicon germanium layer;
    depositing a gate layer on the gate oxide layer;
    patterning the gate layer, the gate oxide layer, and the silicon germanium layer; and
    after forming the gate oxide layer, oxidizing the silicon germanium layer to form a nanocrystal in the silicon germanium layer.

2. The method according to claim 1, wherein stacking the silicon layer and the silicon germanium layer above the wafer further comprises:
    depositing a bottom silicon layer on the wafer; and
    depositing the silicon layer on the bottom silicon layer.

3. The method according to claim 1, wherein oxidizing the silicon germanium layer further comprises:
    forming the nanocrystal in between the gate layer and the silicon layer; and
    forming a tunnel oxide layer in between the nanocrystal and the silicon layer.

4. The method according to claim 1, wherein the wafer is a silicon on insulator wafer.

5. The method according to claim 1, further comprising:
    depositing the wafer on an existing circuit layer;
    forming an insulator on the wafer; and
    depositing the silicon layer and the silicon germanium layer on the insulator.

6. The method according to claim 5, wherein the silicon layer and the silicon germanium layer are polycrystalline.

7. The method according to claim 6, further comprising:
    treating the silicon layer to form at least one doped region therein.

8. The method according to claim 3, wherein a diameter of the nanocrystal ranges between 2 and 10 nm.

9. The method according to claim 1, wherein patterning the gate layer, the gate oxide layer, and the silicon germanium layer further comprises:
    removing portions of the gate layer to form gaps, wherein the gap ranges between 6 and 30 nm.

10. A method comprising:
    forming a channel region on a wafer;
    forming a fin in the channel region;
    forming a gate oxide layer over the fin;
    depositing a gate layer over the gate oxide layer;
    patterning the gate layer, the gate oxide layer, and the fin; and
    oxidizing the fin to form a nanocrystal above a top surface of the channel region.

11. The method according to claim 10, wherein the fin includes a silicon layer and a silicon germanium layer over the silicon layer.

12. The method according to claim 11, wherein oxidizing the fin further comprises:
    oxidizing the silicon germanium layer to form the nanocrystal in between the gate layer and the silicon layer.

13. The method according to claim 12, wherein a diameter of the nanocrystal ranges between 2 and 10 nm.

14. The method according to claim 10, wherein forming the channel region on the wafer further comprises:
    forming a source/drain region defining the channel region; and
    forming insulating structures flanking the channel region.

15. The method according to claim 10, wherein forming the channel region on the wafer further comprises:
    depositing a bottom silicon layer in the channel region.

16. The method according to claim 10, wherein patterning the gate layer, the gate oxide layer, and the fin further comprises:
    removing portions of the gate layer to form gaps, wherein the gap ranges between 6 and 30 nm.

17. The method according to claim 10, wherein the wafer is a silicon on insulator wafer.

18. A method comprising:
    forming a plurality of first strips on a wafer and arranged in a first direction;
    forming a plurality of second strips that include a different material than the first strips on the first strips and that are arranged in the first direction;
    forming a gate oxide layer on the first and second strips;
    depositing a gate layer on the gate oxide layer;
    patterning the gate layer, the gate oxide layer, and the second strips such that the gate layer is arranged on a sidewall of the second strips; and
    after depositing the gate layer, oxidizing the patterned second strips.

19. The method according to claim 18, wherein the plurality of first strips has a dopant and the gate layer is intrinsic.

20. The method according to claim 18, wherein the first strips include silicon and the second strips include silicon germanium.

* * * * *